United States Patent
Amit et al.

(10) Patent No.: US 8,782,019 B2
(45) Date of Patent: Jul. 15, 2014

(54) SEPARATION OF DATA CHUNKS INTO MULTIPLE STREAMS FOR COMPRESSION

(75) Inventors: Jonathan Amit, Yehud (IL); Ori Shalev, Yehud (IL)

(73) Assignee: International Business Machines Corporation, Armonk, NY (US)

(*) Notice: Subject to any disclaimer, the term of this patent is extended or adjusted under 35 U.S.C. 154(b) by 28 days.

(21) Appl. No.: 13/535,023

(22) Filed: Jun. 27, 2012

(65) Prior Publication Data

US 2013/0179411 A1 Jul. 11, 2013

Related U.S. Application Data

(63) Continuation of application No. 13/345,324, filed on Jan. 6, 2012, now abandoned.

(51) Int. Cl.
*G06F 7/00* (2006.01)
*G06F 17/00* (2006.01)

(52) U.S. Cl.
USPC .......................................... 707/693; 707/694

(58) Field of Classification Search
None
See application file for complete search history.

(56) References Cited

U.S. PATENT DOCUMENTS

| | | | |
|---|---|---|---|
| 5,802,315 A | 9/1998 | Uchiumi et al. | |
| 5,982,937 A | 11/1999 | Accad | |
| 6,212,301 B1 | 4/2001 | Warner et al. | |
| 6,215,904 B1 | 4/2001 | Lavallee | |
| 6,567,559 B1 * | 5/2003 | Easwar | 382/239 |
| 7,161,506 B2 | 1/2007 | Fallon | |
| 7,321,937 B2 | 1/2008 | Fallon | |
| 7,352,300 B2 | 4/2008 | Fallon | |
| 7,378,992 B2 | 5/2008 | Fallon | |
| 7,693,328 B2 * | 4/2010 | Moritani | 382/166 |
| 7,844,097 B2 * | 11/2010 | Wegener | 382/131 |
| 2003/0081845 A1 * | 5/2003 | Mukherjee et al. | 382/239 |
| 2005/0132045 A1 * | 6/2005 | Hornback et al. | 709/225 |
| 2010/0228800 A1 * | 9/2010 | Aston et al. | 707/822 |
| 2011/0307447 A1 * | 12/2011 | Sabaa et al. | 707/637 |
| 2011/0320417 A1 * | 12/2011 | Luo et al. | 707/693 |

FOREIGN PATENT DOCUMENTS

| | | |
|---|---|---|
| CN | 101241508 A | 8/2008 |
| CN | 101957836 A | 1/2011 |

OTHER PUBLICATIONS

Hsu, William H. and Zwarico, Amy E. Automatic Synthesis of Compression Techniques for Heterogeneous Files, Software-Practice and Experience, Oct. 1995, vol. 25(10), 1097-1116, John Wiley & Sons Ltd.
Ligtenberg, Adriaan, JPEG++: Selective Compression for High Quality Color Desktop Publishing, 1991, 5 pages, Storm Technology, Inc., Palo Alto, CA, USA.

* cited by examiner

*Primary Examiner* — Tony Mahmoudi
*Assistant Examiner* — Tuan A Pham
(74) *Attorney, Agent, or Firm* — Griffiths & Seaton PLLC

(57) ABSTRACT

For on-line separation of data chunks for compression, unrelated data chunks are classified based on various attributes. The classified data chunks are sent to at least one available compression contexts. The classified data chunks are related. The classified data chunks are encoded by at least one the compression operations. A compression ratio is achieved and included as feedback.

8 Claims, 6 Drawing Sheets

SEPARATION OF DATA CHUNKS INTO MULTIPLE STREAMS FOR COMPRESSION

CROSS-REFERENCE TO RELATED APPLICATIONS

The present application is a Continuation of U.S. patent application Ser. No. 13/345,324, filed Jan. 6, 2012.

BACKGROUND OF THE INVENTION

1. Field of the Invention

The present invention relates generally to computers, and more particularly, to separation of data chunks into multiple streams for compression in a computing environment.

2. Description of the Related Art

In today's society, computer systems are commonplace. Computer systems may be found in the workplace, at home, or at school. Computer systems may include data storage systems, or disk storage systems, to process and store data. In recent years, both software and hardware technologies have experienced amazing advancement. With the new technology, more and more functions are added and greater convenience is provided for use with these electronic appliances. One of the most noticeable changes introduced by recent computer technology is the inclusion of images, video, and audio to enhance the capabilities of computers and electronic appliances. In the age of multimedia, the amount of information to be processed increases greatly. One popular method of handling large data files is to compress the data for storage or transmission. Processing very large amounts of information is a key problem to solve, and therefore, a need exists to improve the compression of data for storage or transmission.

SUMMARY OF THE DESCRIBED EMBODIMENTS

With increasing demand for faster, more powerful and more efficient ways to store information, optimization of storage technologies is becoming a key challenge. Logical data objects (data files, image files, data blocks, etc.) may be compressed for transmission and/or storage. Data compression techniques are used to reduce the amount of data to be stored and/or transmitted in order to reduce the storage capacity and/or transmission time respectively. Compression may be achieved by using different compression algorithms, for example, by sequential data compression, which takes a stream of data as an input and generates a usually shorter stream of output from which the original data can be restored. Computing storage systems may be used by employing various write patterns. In one pattern, there may be a single active transaction operating exclusively on the storage system. In another storage system, there may be multiple transactions concurrently writing unrelated data.

Accordingly, and in view of the foregoing, various exemplary method embodiments for on-line separation of data chunks for compression are provided. In one embodiment, by way of example only, unrelated data chunks are classified based on various attributes. The classified data chunks are sent to at least one available compression contexts. The classified data chunks are related. The classified data chunks are encoded by at least one the compression operations. A compression ratio is achieved and included as feedback.

The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF CERTAIN EMBODIMENTS

As mentioned previously, with increasing demand for faster, more powerful and more efficient ways to store information, optimization of storage technologies is becoming a key challenge. Computing storage systems may use various write patterns for writing data chunks. In one pattern, there may be a single active transaction operating exclusively on the storage system. In another storage system, there may be multiple transactions concurrently writing unrelated data. In classical compression, a whole object or file is sequentially being fed into a compression stream that encodes the data. A bounded "window" of recent input data for generating the compressed output may be used. In temporal compression, the data is being passed to the compression stream in a chronological order, usually the order of writes to the storage device. In the case of a single user writing to a storage device, temporal compression achieves similar or higher compression ratio to sequential compression. However, with multiple users or multiple concurrent transactions, different sets of data entities are being written and processed by the temporal compression mechanism. As a result, the bounded window of recent input, used by the compression algorithm, may contain segments of unrelated data chunks (e.g., data pieces), which leads to the reduction in an overall compression ratio.

In contrast, and to address the inefficiencies previously described, the mechanisms of the illustrated embodiments separate the compression of unrelated pieces of data based on various properties of the data, including meta-data, if available. Each piece of data destined for compression is examined, (e.g., by a classifier component) that may either select an existing compression context or create a new compression context. Each compression context may provide feedback on a compression ratio that is achieved. The mechanisms of the compression contexts may use different compression algorithms.

Figure 1:
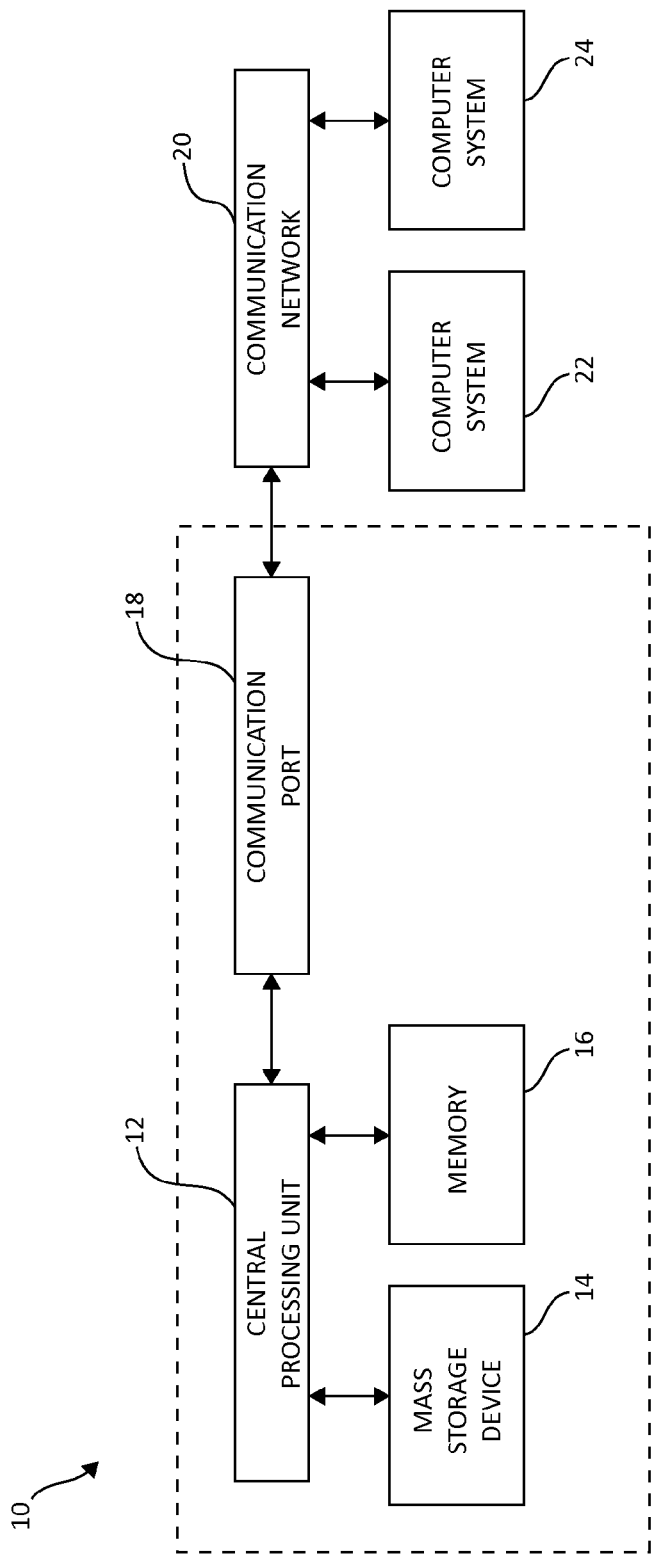
FIG. 1 illustrates a computer storage environment having an example storage device in which aspects of the present invention may be realized.

Turning to FIG. 1, an example computer system 10 is depicted in which aspects of the present invention may be realized. Computer system 10 includes central processing unit (CPU) 12, which is connected to mass storage device(s) 14 and memory device 16. Mass storage devices may include hard disk drive (HDD) devices, which may be configured in a redundant array of independent disks (RAID). Memory device 16 may include such memory as electrically erasable programmable read only memory (EEPROM) or a host of related devices. Memory device 16 and mass storage device 14 are connected to CPU 12 via a signal-bearing medium. In addition, CPU 12 is connected through communication port 18 to a communication network 20, having an attached plurality of additional computer systems 22 and 24. The computer system 10 may include one or more processor devices (e.g., CPU 12) and additional memory devices 16 for each individual component of the computer system 10.

Figure 2:
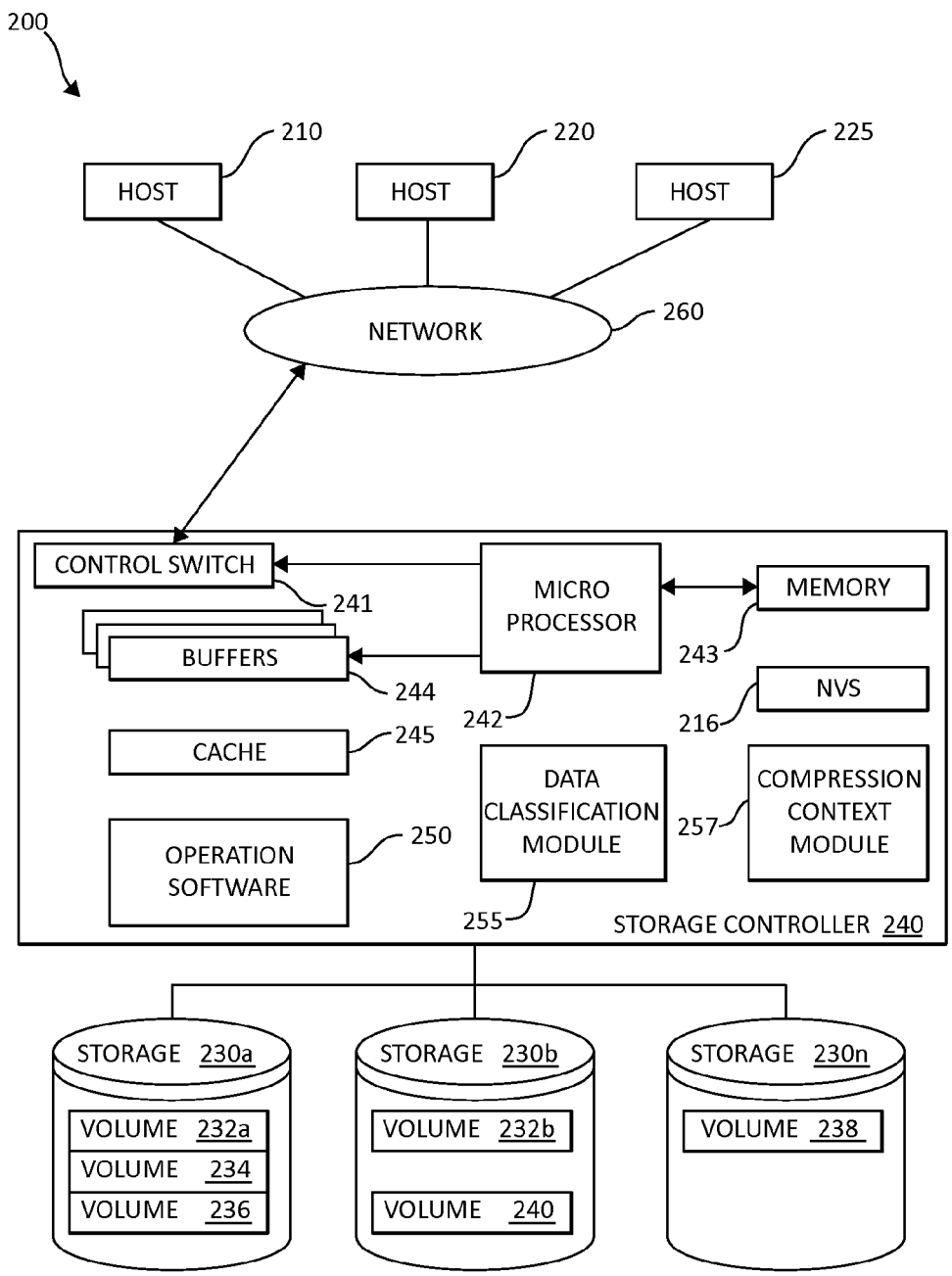
FIG. 2 illustrates an exemplary block diagram showing a hardware structure of a data storage system in a computer system in which aspects of the present invention may be realized.

FIG. 2 is an exemplary block diagram 200 showing a hardware structure of a data storage system in a computer system according to the present invention. Host computers 210, 220, 225, are shown, each acting as a central processing unit for performing data processing as part of a data storage system 200. The cluster hosts/nodes (physical or virtual devices), 210, 220, and 225 may be one or more new physical devices or logical devices to accomplish the purposes of the present invention in the data storage system 200. A Network (e.g., storage fabric) connection 260 may be a fibre channel fabric, a fibre channel point-to-point link, a fibre channel over ethernet fabric or point to point link, a FICON or ESCON I/O interface. The hosts, 210, 220, and 225 may be local or distributed among one or more locations and may be equipped with any type of fabric (or fabric channel) (not shown in FIG. 2) or network adapter 260 to the storage controller 240, such as Fibre channel, FICON, ESCON, Ethernet, fiber optic, wireless, or coaxial adapters. Data storage system 200 is accordingly equipped with a suitable fabric (not shown in FIG. 2) or network adapter 260 to communicate. Data storage system 200 is depicted in FIG. 2 comprising storage controllers 240 and cluster hosts 210, 220, and 225. The cluster hosts 210, 220, and 225 may include cluster nodes.

To facilitate a clearer understanding of the methods described herein, storage controller 240 is shown in FIG. 2 as a single processing unit, including a microprocessor 242, system memory 243 and nonvolatile storage ("NVS") 216, which will be described in more detail below. It is noted that in some embodiments, storage controller 240 is comprised of multiple processing units, each with their own processor complex and system memory, and interconnected by a dedicated network within data storage system 200. Moreover, given the use of the storage fabric network connection 260, additional architectural configurations may be employed by using the storage fabric 260 to connect multiple storage controllers 240 together with one or more cluster hosts 210, 220, and 225 connected to each storage controller 240.

In some embodiments, the system memory 243 of storage controller 240 includes operation software 250 and stores program instructions and data which the processor 242 may access for executing functions and method steps associated with executing the steps and methods of the present invention. As shown in FIG. 2, system memory 243 may also include or be in communication with a cache 245, also referred to herein as a "cache memory", for buffering "write data" and "read data", which respectively refer to write/read requests and their associated data. In one embodiment, cache 245 is allocated in a device external to system memory 243, yet remains accessible by microprocessor 242 and may serve to provide additional security against data loss, in addition to carrying out the operations as described herein.

In some embodiments, cache 245 may be implemented with a volatile memory and non-volatile memory and coupled to microprocessor 242 via a local bus (not shown in FIG. 2) for enhanced performance of data storage system 200. The NVS 216 included in data storage controller is accessible by microprocessor 242 and serves to provide additional support for operations and execution as described in other figures. The NVS 216, may also referred to as a "persistent" cache, or "cache memory" and is implemented with nonvolatile memory that may or may not utilize external power to retain data stored therein. The NVS may be stored in and with the cache 245 for any purposes suited to accomplish the objectives of the present invention. In some embodiments, a backup power source (not shown in FIG. 2), such as a battery, supplies NVS 216 with sufficient power to retain the data stored therein in case of power loss to data storage system 200. In certain embodiments, the capacity of NVS 216 is less than or equal to the total capacity of cache 245.

The storage controller 240 may include a data classification module 255 and a compression context module 257. The data classification module 255 and compression context components 257 may be one complete module functioning simultaneously or separate modules. The data classification module 255 and compression context components 257 may have some internal memory (not shown) in which the compression algorithm may store unprocessed, processed, or "semi-processed" data. The data classification module 255 and compression context module 257 may work in conjunction with each and every component of the storage controller 240, the hosts 210, 220, 225, and other storage controllers 240 and hosts 210, 220, and 225 that may be remotely connected via the storage fabric 260. Both the data classification module 255 and compression context module 257 may be structurally one complete module or may be associated and/or included with other individual modules. The data classification module 255 and compression context module 257 may also be located in the cache 245 or other components of the storage controller 240.

The storage controller 240 includes a control switch 241 for controlling the fiber channel protocol to the host computers 210, 220, 225, a microprocessor 242 for controlling all the storage controller 240, a nonvolatile control memory 243 for storing a microprogram (operation software) 250 for controlling the operation of storage controller 240, cache 245 for temporarily storing (buffering) data, and buffers 244 for assisting the cache 245 to read and write data, a control switch 241 for controlling a protocol to control data transfer to or from the data classification module 255 and the compression context module 257 in which information may be set. Multiple buffers 244 may be implemented to assist with the methods and steps as described herein.

In one embodiment, the cluster hosts/nodes, 210, 220, 225 and the storage controller 240 are connected through a network adaptor (this could be a fibre channel) 260 as an interface i.e., via a switch called "fabric." In one embodiment, the operation of the system shown in FIG. 2 may be described as follows. The microprocessor 242 may control the memory 243 to store command information from the cluster host/node device (physical or virtual) 210 and information for identifying the cluster host/node device (physical or virtual) 210. The control switch 241, the buffers 244, the cache 245, the operating software 250, the microprocessor 242, memory 243, NVS 216, data classification module 255, and compression context module 257 are in communication with each other and may be separate or one individual component(s). Also, several, if not all of the components, such as the operation software 250 may be included with the memory 243. Each of the components within the devices shown may be linked together and may be in communication with each other for purposes suited to the present invention.

Figure 3:
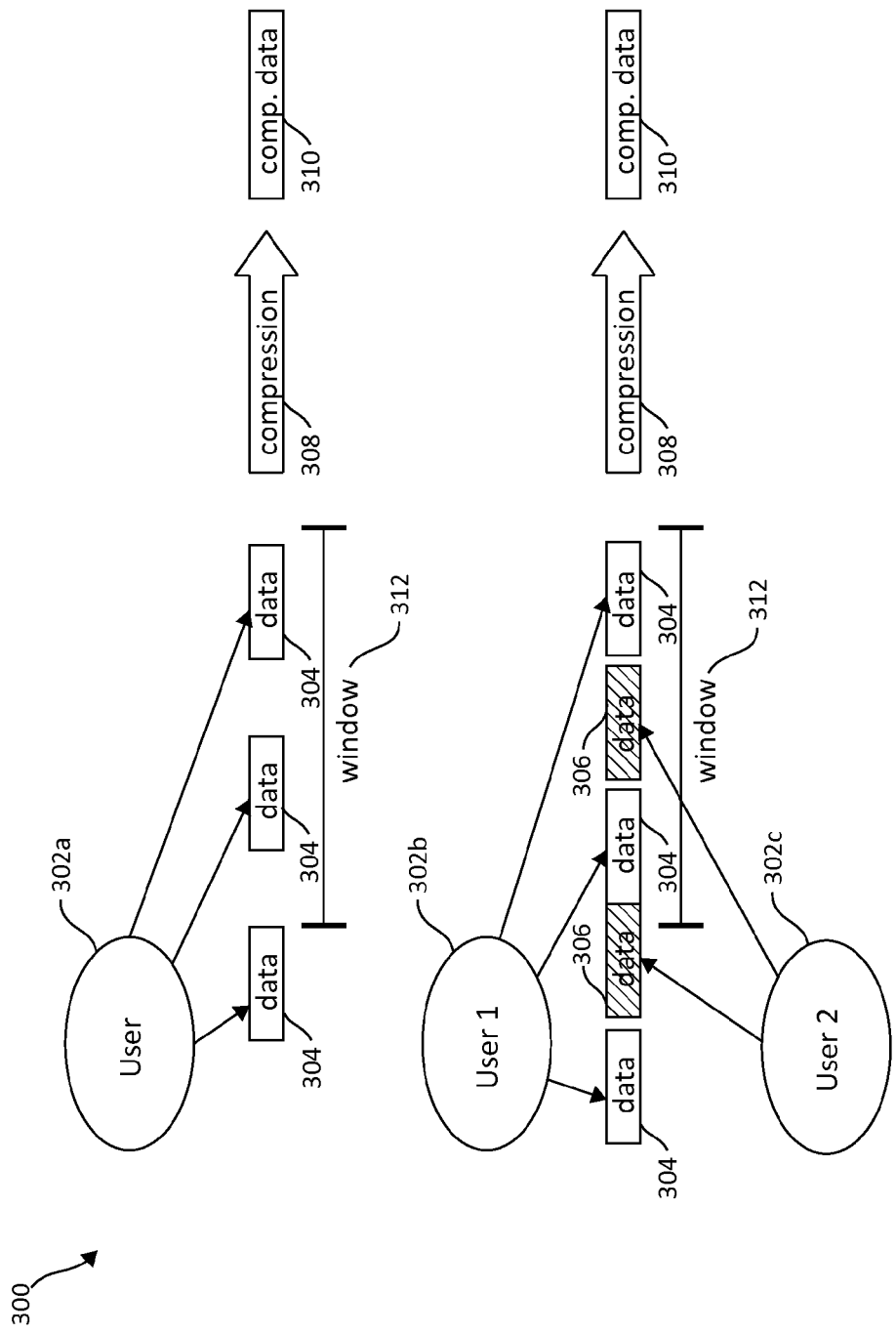
FIG. 3 illustrates an exemplary block diagram of unrelated data being sent for compression.

FIG. 3 illustrates an exemplary block diagram 300 of unrelated data being sent for compression. In FIG. 3, multiple transactions are concurrently writing unrelated data. Multiple users 302 (illustrated as 302A-C) are concurrently writing data 304 and 306 (e.g., illustrated 304 and 306 to indicate unrelated data chunks). An entire object or file is sequentially being fed into a compression stream that encodes the data. The compression algorithms 308 use a bounded window 312 of recent input data 304 and 306 for generating the compressed output of compression data 310. As a result, the bounded window 312 of recent input data 304 and 306, used by the compression algorithm 308, may contain segments of unrelated data pieces 304 and 306.

Figure 4:
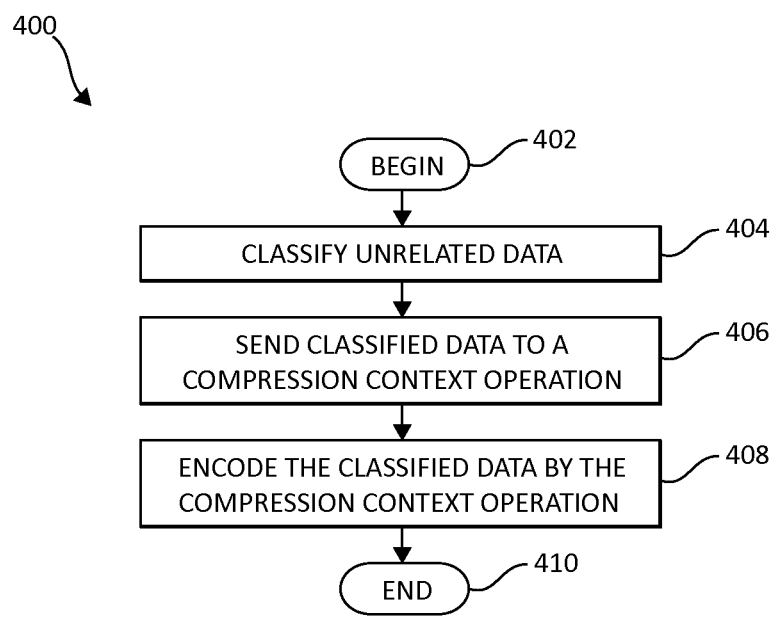
FIG. 4 is a flowchart illustrating an exemplary method for separating unrelated data chunks into classified data chunks for compression.

The mechanisms of the present invention, by way of example only, provide on-line separation of data chunks for compression. Unrelated data chunks are classified based on various attributes. The classified data chunks are sent to at least one available compression contexts. The classified data chunks are related. The classified data chunks are encoded by at least one the compression operations. A compression ratio is achieved for being included in feedback. Turning to FIG. 4, a flowchart illustrates an exemplary method 400 for separating unrelated data chunks into classified data chunks for compression is depicted. The method 400 begins (step 402). Unrelated data chunks are classified and/or separated based one or more attributes (step 404). The classified and/or separated data chunks are sent to at least one compression context (step 406). The classified data that are sent to one of the compression contexts are related. The classified data is encoded by one of the compression context operations (step 408). The method 400 ends (step 410).

Figure 5:
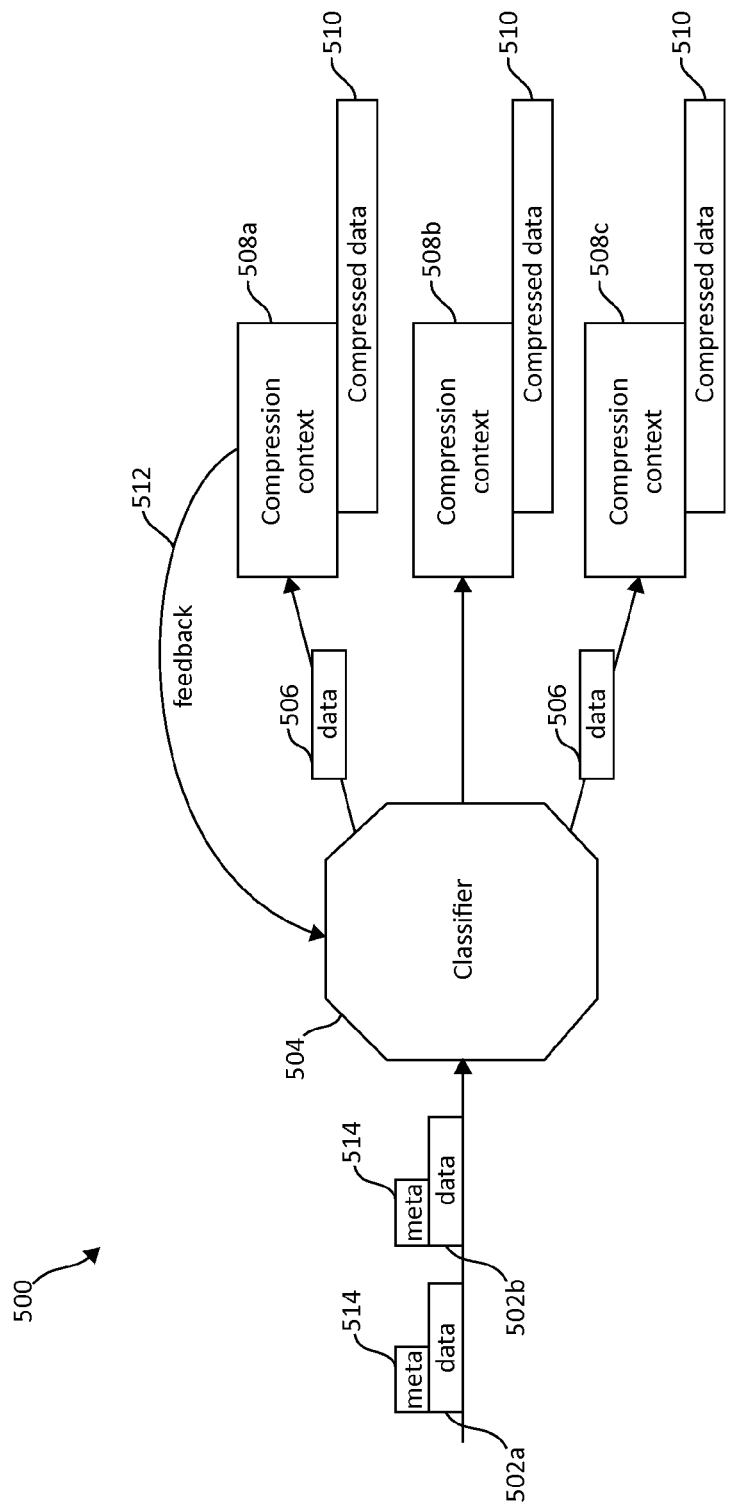
FIG. 5 illustrates an exemplary block diagram for separating unrelated data chunks into classified data chunks for compression.

FIG. 5 illustrates an exemplary block diagram for separating unrelated data chunks into classified data chunks for compression. A classifier component 504 receives data chunks 502 (illustrated as 502A-B), possibly accompanied by meta-data 514. Upon receiving the data chunks 502, the classifier 504 classifies and/or separates the unrelated data chunks 502 into related data 506 based upon various attributes. The classifier 504 sends the related data 506 to one or more of the compression context components 508 (illustrated as 508A-C). The compression context components 508 receive data chunks as input and generate compressed data (e.g., related compressed data) as output. The compression context component 508 also encodes the related data 506 using a selected compression algorithm(s). The compression context components 508 may report statistical information (or other necessary information needed by the classifier 504) as feedback 512 to the classifier 504.

Having sent the related data (e.g., classified/separated data that is related) 506 to one of the compression context components 508, the classifier 504 may decide to re-send the related data 506 to an alternative compression context 508. If the related data 506 is re-sent to another compression context component 508 (e.g., for example, resent from 508A to 508C) the classifier 504 may send a notification to the compression context component (e.g., for example 508A) that first received the related, classified/data 506, for indicating some of the compression context component's 508 input data (e.g., the related data 506) is now being handled by other compression contexts 508 (e.g., for example 508C).

As mentioned above, upon receiving the data chunks 502, the classifier 504 classifies and/or separates the unrelated data chunks 502 into related data 506 based upon various attributes. The classifying decision may be based on one or more of the following data attributes: 1) known format—fingerprinting: classifying the data type by detecting known formats, such as known headers, 2) character distribution (e.g., ASCII, binary, specific language, etc.): classifying the data chunk by analyzing its statistical characteristics—for example, if there are only English text characters, the data chunk will be sent to the same compression context that may be handling English text data, 3) similarity between previously classified data and the data currently being classified, and 4) using the feedback from the compression contexts and selecting the compression context that generated the best compression ratio for similarly classified/separated data. With the fourth attribute, the classification of the new unrelated data chunks may be achieved with this attribute by using the feedback from the compression contexts achieved from previously classified data chunks and then selecting the compression context that generated the best compression ratio on similar data. For example, if a data chunk has parts that are similar by character distribution or by identical substrings to another data chunk that was sent to a specific compression context, without understanding the type of data, the mechanisms may send the new data chunk to the same compression context.

Moreover, as previously mentioned, the unrelated data chunks may include meta-data. As part of classifying and separating the unrelated data chunks into related data, the classifying decision may be based on one or more of the following meta-data attributes: 1) source identifiers (e.g., identifies the user and/or server from which the unrelated data chunk is received and/or originated), if available, 2) the size of the data chunk—similar size indicates possible data similarity, 3) the offset position of the data chunks (e.g., data chunks that have adjacent positions indicates data similarity because data chunks written to adjacent locations in a block device are more likely to be written by the same entity thus leading to increase compression when compressing the adjacent data chunks, and 4) a transaction token passed from various layers. For example, some applications and communications layers allow for the passing of meta-data with the data chunks, which may be visible at compression enhanced layers. The meta-data may indicate a relationship between the data chunks. Additionally, the classification and separation decision may be based on the feedback provided by the compression contexts.

Figure 6:
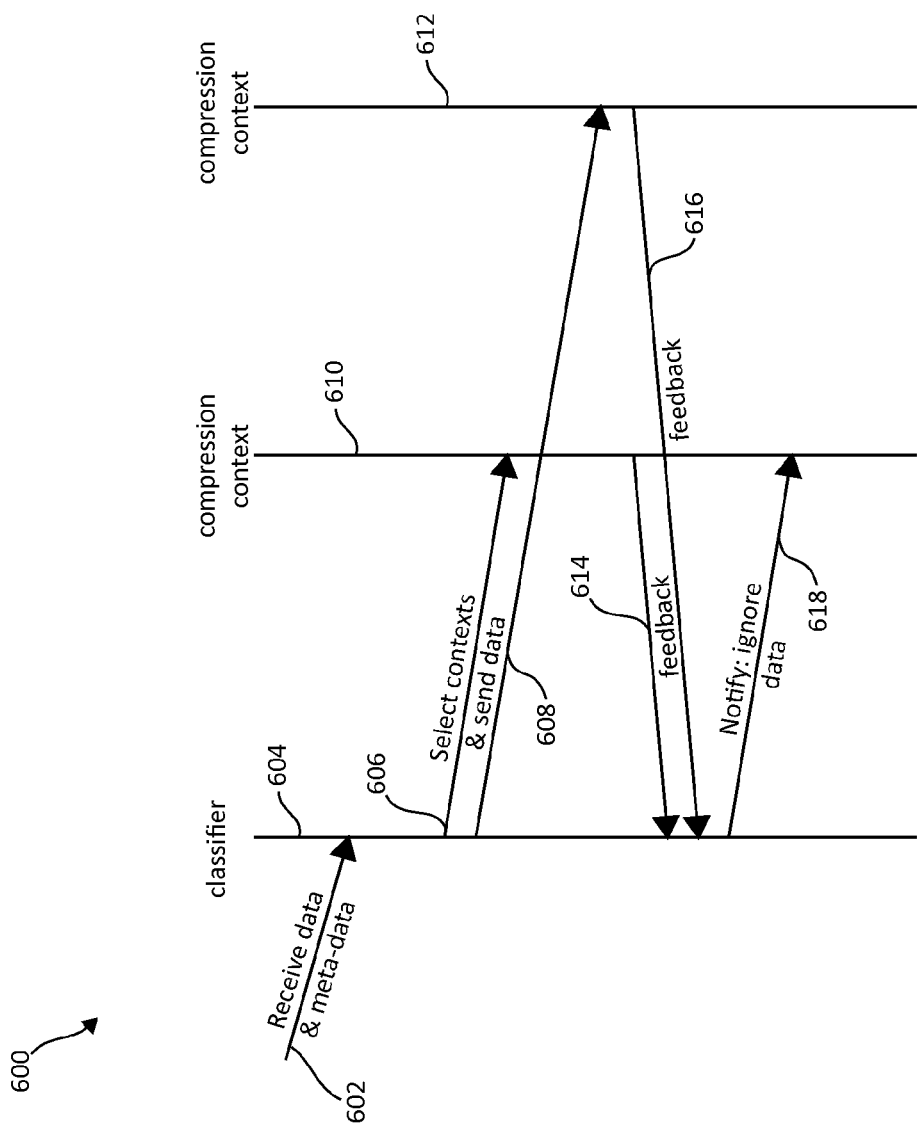
FIG. 6 illustrates an exemplary diagram for separating unrelated data chunks into classified data chunks for compression using feedback.

To further illustrate the processes of FIG. 4-5, FIG. 6 illustrates an exemplary diagram for separating data chunks into multiple streams for compression using feedback in which aspects of the present invention may be realized. First, data chunks 602 (with meta-data) are received by a classifier 604. The classifier 604 classifies the unrelated data into related data. The classifier sends two separate classified data chunks that are related to a selected compression context 610 and 612. The compression contexts 610 and 612 send feedback 614 and 616 back to the classifier 604. Upon receiving various statistical information (and/or other feedback), including an achieved compression ratio, the classifier 604 may decide to re-send the one of the classified data chunks to an alternative compression context and then sends a notification 618 to the compression context component 610 that one of the classified data chunks should be ignored and informs the compression context component's 610 input data is now being handled by other compression contexts.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagram in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A method for on-line separation of data chunks for compression by a processor device in a computing storage environment, the method comprising:
   classifying unrelated data chunks based on one of a plurality of attributes into related classified data chunks, wherein at least one of the plurality of attributes includes at least one of a plurality of data attributes and a plurality of meta-data attributes, and the at least one of the plurality of data attributes includes at least one of known data formats, a character distribution, and similarity between previously classified data chunks provided from the feedback and the unrelated data chunks currently being analyzed for the classifying;
   sending the classified data chunks into at least one of a plurality of available compression contexts;
   encoding the classified data chunks by at least one of a plurality of compression operations, wherein a compression ratio is achieved and included as feedback;
   based on the feedback, resending one or more of the classified data chunks to an alternative one of the at least one of the plurality of available compression contexts for handling the classified data chunks;

sending a notification to the at least one of the plurality of available compression contexts to ignore the classified data chunks and that the alternative one of the at least one of the plurality of available compression contexts is handling the one or more classified data chunks; and in conjunction with the classifying, selecting an existing one of the at least one of the plurality of available compression contexts and creating a new one of the at least one of the plurality of available compression contexts.

2. The method of claim 1, wherein the plurality of meta data attributes includes at least one of identification of the source of the unrelated data chunks, a size of the unrelated data chunks, an offset of the unrelated data chunks, and a transaction token passed from one of a plurality of layers.

3. The method of claim 1, further including, pursuant to the sending, using one of a plurality of available compression operations on the classified data chunks.

4. A system for on-line separation of data chunks for compression in a computing environment, comprising:

a processor device operable in the computing environment, wherein processor device is adapted for:

classifying unrelated data chunks based on one of a plurality of attributes into related classified data chunks, wherein at least one of the plurality of attributes includes at least one of a plurality of data attributes and a plurality of meta-data attributes, and the at least one of the plurality of data attributes includes at least one of known data formats, a character distribution, and similarity between previously classified data chunks provided from the feedback and the unrelated data chunks currently being analyzed for the classifying;

sending the classified data chunks into at least one of a plurality of available compression contexts;

encoding the classified data chunks by at least one of a plurality of compression operations, wherein a compression ratio is achieved and included as feedback;

based on the feedback, resending one or more of the classified data chunks to an alternative one of the at least one of the plurality of available compression contexts for handling the classified data chunks;

sending a notification to the at least one of the plurality of available compression contexts to ignore the classified data chunks and that the alternative one of the at least one of the plurality of available compression contexts is handling the one or more classified data chunks; and in conjunction with the classifying, selecting an existing one of the at least one of the plurality of available compression contexts and creating a new one of the at least one of the plurality of available compression contexts.

5. The system of claim 4, wherein the plurality of meta data attributes includes at least one of identification of the source of the unrelated data chunks, a size of the unrelated data chunks, an offset of the unrelated data chunks, and a transaction token passed from one of a plurality of layers.

6. A computer program product for on-line separation of data chunks for compression in a computing environment by a processor device, the computer program product comprising a non-transitory computer-readable storage medium having computer-readable program code portions stored therein, the computer-readable program code portions comprising:

a first executable portion for classifying unrelated data chunks based on one of a plurality of attributes into related classified data chunks, wherein at least one of the plurality of attributes includes at least one of a plurality of data attributes and a plurality of meta-data attributes, and the at least one of the plurality of data attributes includes at least one of known data formats, a character distribution, and similarity between previously classified data chunks provided from the feedback and the unrelated data chunks currently being analyzed for the classifying;

a second executable portion for sending the classified data chunks into at least one of a plurality of available compression contexts;

a third executable portion for encoding the classified data chunks by at least one of a plurality of compression operations, wherein a compression ratio is achieved and included as feedback;

a fourth executable portion for, based on the feedback, resending one or more of the classified data chunks to an alternative one of the at least one of the plurality of available compression contexts for handling the classified data chunks;

a fifth executable portion for sending a notification to the at least one of the plurality of available compression contexts to ignore the classified data chunks and that the alternative one of the at least one of the plurality of available compression contexts is handling the one or more classified data chunks; and a sixth executable portion for, in conjunction with the classifying, selecting an existing one of the at least one of the plurality of available compression contexts and creating a new one of the at least one of the plurality of available compression contexts.

7. The computer program product of claim 6, wherein the plurality of meta data attributes includes at least one of identification of the source of the unrelated data chunks, a size of the unrelated data chunks, an offset of the unrelated data chunks, and a transaction token passed from one of a plurality of layers.

8. The computer program product of claim 6, further including a seventh executable portion for, pursuant the sending, using one of a plurality of available compression operations on the classified data chunks.

* * * * *